United States Patent [19]
Meissner et al.

[11] Patent Number: 5,563,899
[45] Date of Patent: Oct. 8, 1996

[54] COMPOSITE SOLID STATE LASERS OF IMPROVED EFFICIENCY AND BEAM QUALITY

[76] Inventors: Helmuth E. Meissner, 3430 Byron Ct., Pleasanton, Calif. 84588; John M. McMahon, 8616 Wild Olive Dr., Potomac, Md. 20854

[21] Appl. No.: 339,147

[22] Filed: Nov. 14, 1994

Related U.S. Application Data

[60] Continuation-in-part of Ser. No. 330,174, Oct. 27, 1994, which is a division of Ser. No. 919,374, Jul. 29, 1992, Pat. No. 5,441,803, which is a continuation of Ser. No. 672,251, Mar. 20, 1991, which is a continuation-in-part of Ser. No. 597,987, Oct. 15, 1990, abandoned, which is a continuation of Ser. No. 446,214, Dec. 5, 1989, abandoned, which is a division of Ser. No. 238,563, Aug. 30, 1988, abandoned.

[51] Int. Cl.⁶ .................................................. H01S 3/14
[52] U.S. Cl. ................ 372/39; 372/66; 372/70; 372/35; 372/92
[58] Field of Search ................ 372/66, 35, 69, 372/71, 68, 92, 70, 39

[56] References Cited

U.S. PATENT DOCUMENTS

| | | | |
|---|---|---|---|
| 3,565,508 | 2/1971 | DuMont . | |
| 3,590,004 | 6/1971 | Woodcock | 372/68 |
| 3,675,155 | 7/1972 | Landry et al. . | |
| 3,755,757 | 8/1973 | Woodcock . | |
| 3,880,632 | 4/1975 | Podvigalkina . | |
| 3,963,347 | 6/1976 | Segre et al. . | |
| 3,978,427 | 8/1976 | Truscott . | |
| 4,149,902 | 4/1979 | Mauer et al. . | |
| 4,509,175 | 4/1985 | Daly et al. | 372/92 |
| 4,531,809 | 7/1985 | Carter et al. . | |
| 4,638,552 | 1/1987 | Shimbo et al. . | |
| 4,810,318 | 3/1989 | Haisma et al. . | |
| 4,984,246 | 1/1991 | Cabaret et al. | 372/35 |
| 5,033,058 | 7/1991 | Cabaret et al. | 372/35 |
| 5,084,888 | 1/1992 | Tajima et al. | 372/66 |
| 5,239,549 | 8/1993 | Tajima et al. | 372/66 |

FOREIGN PATENT DOCUMENTS

| | | |
|---|---|---|
| 0136050 | 5/1984 | European Pat. Off. . |
| 0232935 | 1/1987 | European Pat. Off. . |

OTHER PUBLICATIONS

Bowman et al, NRL Lasert Physics Branch:"Power Scaling of Diode–Pumped 2–Micron Lasers" Nov.15–18 1993.

Lee et al, Optocs In Montana'91; Topical Meeting on CTH:YAG vol. 1, Aug. 13–15, 1991.

McLellan, G. W. *Glass Engineering Handbook*. Third Edition, pp. 1—1 to 1—3 and 4—4 to 4—11.

S. R. Bowman, et al. *Power Scaling of Diode–Pumped 2–Micron Lasers*, LEOS '93. Nov. 15–18, 1993. 34 pp.

H. C. Lee, et al. *Diffusion Bonded Composites of YAG Single Crystals*. SPIE, vol. 1624, 1991. Laser–Induced Damage in Optical Materials. pp. 2–10.

H. C. Lee, et al. *Single Crystal Composites for EO Applications*, Optics in Montana '91: Topical Meeting on CTH:YAG. vol. 1. Aug. 13–15, 1991. 12 pp.

Onyx Optics. *Design Features and Applications of ONYX OPTICS' Crystal Composites* (A product description). Released May 1994. 3 pp.

H. F. Fischmeister, et al. *Preparation, Properties and Structure of Metal/Oxide Interfaces*. Mat. Res. Soc. Symp. Proc. vol. 122, 1988. pp. 529–540.

(List continued on next page.)

*Primary Examiner*—Leon Scott, Jr.
*Attorney, Agent, or Firm*—David G. Beck; Townsend and Townsend and Crew LLP

[57] ABSTRACT

This invention relates to solid state lasers and more particularly to laserable rods, slabs or other configurations where thermal effects and/or ground state absorption cause a degradation in lasing efficiency and/or beam quality. The improvement in operating efficiency is achieved by using a composite of lasing and non-lasing sections. The composite is formed using diffusion bonding techniques.

14 Claims, 3 Drawing Sheets

OTHER PUBLICATIONS

Hidemi Tajima, et al. *Performance of Composite Glass Slab Laser*. IEEE J. of Quantum Electronics. vol. 28, No. 6, Jun. 1992. pp. 1562–1570.

C. T. Yen, et al. *On Controlled Solidification Studies of Some $TiO_2$ Binary Alloys*. J. Mater. Res. vol. 7, No. 4, Apr. 1992. pp. 980–991.

R. B. Chesler. *A Stabilizing Sleeve for the Nd:YAIG Laser*. Applied Optics. vol. 9, No. 9, Sep. 1970. pp. 2190–2191.

J. McKenna. *The Focusing of Light by a Dielectric Rod*. Applied Optics. vol. 2, No. 3, Mar. 1963. pp. 303–310.

G. E. Devlin, et al. *Composite Rod Optical Masers*. Applied Optics. vol. 1, No. 1, Jan. 1962. pp. 11–15.

S. P. Timoshenko, et al. *Theory of Elasticity*. Third Edition. International Student Edition. Mc–Graw–Hill International Book Company. pp. 39–40.

Tracy S. Kubo, et al. *Diode–Pumped Lasers at Five Eye–Safe Wavelengths*. IEEE J. of Quantum Electronics. vol. 28, No. 4, Apr. 1992. pp. 1033–1040.

Steve C. Tidwell, et al. *Scaling CW Diode–End–Pumped ND:YAG Lasers to High Average Powers*. IEEE J. of Quantum Electronics. vol. 28, No. 4, Apr. 1992. pp. 997–1009.

COMPOSITE SOLID STATE LASERS OF IMPROVED EFFICIENCY AND BEAM QUALITY

GOVERNMENT RIGHTS NOTICE

This invention was made with Government support under Contract No. N00014-93-C-2101 awarded by the Strategic Defense Initiative Organization (SDIO). The Government has certain rights in the invention.

BACKGROUND OF THE INVENTION

This is a continuation-in-part of application Ser. No. 08/330,174, filed Oct. 27, 1994, which is a divisional of application Ser. No. 07/919,374, filed Jul. 29, 1992, now U.S. Pat. No. 5,441,803 which is a continuation of application Ser. No. 07/672,251, filed Mar. 20, 1991, which is a continuation-in-part of application Ser. No. 07/597,987, filed Oct. 15, 1990, now abandoned, which is a continuation of application Ser. No. 07/446,214, filed Dec. 5, 1989, now abandoned, which is a divisional of application Ser. No. 07/238,563, filed Aug. 30, 1988, now abandoned.

This invention relates to solid state lasers and more particularly to laserable rods, slabs or other configurations where thermal effects and/or ground state absorption cause a degradation in lasing efficiency and/or beam quality. The improvement in operating efficiency is achieved by attaching one or two non-lasing sections to a laser-active section which is irradiated with a source of pump energy.

Solid state lasers continue to gain commercial acceptance over other types of lasers based on lasing transitions resulting from excited energy levels of gases or liquid organic dyes. They are increasingly preferred for commercial and defense applications because they are more compact, reliable, safe and economical than competitive schemes. Solid state lasing media consist of crystalline or vitreous hosts containing one or more laser-active paramagnetic ions.

Many applications of solid state lasers such as materials processing and laser detection and ranging require high pulse energy and high pulse repetition rates. Since only a percentage of the applied pump energy is converted into laser radiation, the remaining energy is transferred by competing mechanisms as radiationless transition and absorption to the host lattice, resulting in nonuniform heating of the laserable medium. To counteract the thermal effects generated by the pump radiation, laser media have to be cooled during operation. However, the ensuing nonuniform temperature distribution still places a serious limit on the maximum output energy, repetition rate and beam quality. Comprehensive discussions of thermal effects are presented in W. Koechner, *Solid State Laser Engineering* (Springer Verlag 1988, pp. 350–401) and A. V. Mezenov, L. N. Soms, and A. I. Stepanov, *Thermooptics of Solid State Lasers*, Journal of Soviet Laser Research, pp. 427, Sept. 1987.

The most common means of exciting the ions to lase is to optically pump the laserable medium by concentrating the radiation from flashlamps onto the side of a cylindrical rod. The more specifically this radiation is absorbed by pump bands to excite fluorescence in a laser medium, the more efficiently electric energy to generate optical pump radiation is converted into coherent laser radiation energy. Flashlamps also cause conversion of pump energy into undesirable thermal energy in the laser medium, resulting in decreased efficiency and degraded beam quality. Higher efficiency than with flashlamps is achieved by pumping with semiconductor laser diodes or solid state lasers because the pump emission can be matched closely with one or more absorption bands of the laser medium, thus reducing conversion of pump energy into heat.

The thermal distribution within a rod reaches a steady state at operating conditions when the interval between pulses is short compared with the removal rate of thermal energy from the laser medium. The radial temperature profile of the temperature will peak in the center of the rod and will decrease towards the periphery where the coolant is located. The temperature at the edge will generally be above the coolant temperature because of the thermal impedance of the boundary layer. The shape of the temperature distribution within the rod and the magnitude of the center temperature with reference to the coolant temperature will depend not only on the boundary layer, but also on the spatial distribution of the pump power deposition. For the mathematically simplest case, uniform heating of an infinitely long cylindrical rod, a parabolic temperature profile would be produced in the rod. In general more complex real cases give more complicated profile shapes and higher central temperatures. Since the regions of higher temperatures are located in the center of the medium, the cooler surface will experience tensile stresses. This type of stress distribution results in deformation of the two rod ends. These effects are important for actual systems where the pumped section of a rod is sealed into the cooled pump cavity with O-rings, or other seals and higher stresses can develop in the end regions of the rod because of superposition of the seal-induced stresses and the thermally induced stresses. Fracture occurs when the tensile stresses exceed the tensile fracture strength of the laser medium. Breakage of laser rods occurs, but effects of thermal gradients on the refractive index distribution are even more important when good beam quality of the laser output is desired. Thermal stresses generate gradients in refractive index due to photoelastic effects, thus changing the propagation of light in the lasing medium. These changes in refractive index are superimposed on those caused by its temperature dependence. Similar to the temperature variation, the refractive index of a laser rod in the steady state varies with the square of its radius, corresponding to a spherical lens in the optical path.

Degradation of laser performance due to thermal effects is qualitatively shared by all lasers, whether they are considered three- or four-level lasers. These terms, while in common usage, are not strictly accurate for solid state lasers since the ionic levels of the laser ion, which are generally single energy states in the free ion, are split into many sub-levels by the fields in the host crystal or glass. In the free ion case, an ideal three-level laser has a laser transition to the ground state. No gain, or laser action, is possible until more than half of the ions are emptied out of the ground state into the upper laser level by optical pumping (into the higher lying third level). In the free ion case, a four-level laser is one in which the laser action occurs not to the ground state but to a fourth level above it and below the upper laser level. At a temperature T (in degrees Kelvin), if the separation of this state from the ground state in energy units is $E_L-E_G$, the population of this level in thermal equilibrium relative to the ground state will be in the ratio of $\exp[-(E_L-E_G)/kT]$, where exp[] denotes the exponential function and k is Boltzman's constant. In real lasers the extent of the splitting of the free ion energy levels can itself be several times the thermal energy kT. This raises the possibility of lasing between a low lying component of the upper level and an upper component of the lower level. In such cases, an inversion and hence lasing can occur at much lower excitation levels than would be necessary for the free ion case. At room temperature for example, lasing can occur for holmium with approximately 11 percent of the holmium ions excited; ytterbium requires approximately 5 percent excitation and thulium requires approximately 3 percent excitation. Similar benefits occur for most other so-called three-level lasers. Nonetheless, more excitation is required than for four-level lasers such as neodymium, where the lower state is split by approximately 10 kT, and an inversion can be obtained at much less than 0.1 percent excitation (note that passive losses are the practical lower limit for neodymium lasers). Three-level lasers are, therefore, generally not as efficient as four-level systems, and usually require higher pump energies to reach their lasing threshold. However, for efficient laser operation, all regions of the rod should be as uniformly excited above threshold as possible because remaining ions in the ground state will absorb the emitted radiation and cause a loss in output as well as requiring higher excitation of the strongly pumped regions. This can affect the reliability of the pumping system and can also in some cases lead to excessive amounts of extra heating by mechanisms known as excited state absorption and upconversion. This problem is encountered at rod or slab ends which are outside of the pump cavity. Therefore, loss due to ground state absorption of laser radiation in sections shielded by fixturing or otherwise from pump radiation has been reduced in the prior art by a variety of approaches. First, the percentage of unpumped laser medium is kept to a minimum, e.g. of the order of 7 to 10% of the overall rod length. This will, unfortunately, result in additional thermal effects in the unpumped end sections, and result in increased lensing and beam degradation, especially because the ends are also not cooled. Nonmasking laser rod holders are disclosed in U.S. Pat. No. 3,978,427. In this patent an optimized performance for an erbium glass laser rod is claimed. The holders consist of a non-absorbing material and allow the pump light to reach into most of the rod ends. Unfortunately, the complicated design results in an expensive arrangement while the rod ends still are not effectively cooled. A third technique consists of attaching a sapphire tube to the faces of the laser rod on each side with organic adhesive. All of the laser-active medium of this rod configuration is pumped and cooled. Although this design has yielded encouraging results, it suffers from the disadvantage of requiring a bond between the laser rod and the two sleeves at its two faces. Leakage of coolant through the eventually failing bond results in significantly reduced long-term reliability. In addition, the optically coated faces become difficult to access for cleaning and may not readily be salvaged for reworking because of the loss in length in the refinishing process as well as the difficulty of completely separating the sleeves from the laser rod. Depending on the fabrication of this arrangement, additional efficiency problems may arise due to masking or vignetting by misaligned sleeves leading to the creation of an aperture on the cross section of the laser rod.

The photoelastic effect induces the rod to have different focal lengths for light with radial and tangential polarization. Therefore resonator designs cannot completely compensate for the thermal lens of both types of polarization simultaneously, and a linearly polarized wave will always have two focal points, corresponding to light with radial and tangential polarization. This depolarization impacts the efficiency of specific lasing operations such as frequency conversion and electro-optic Q-switching. Thermal lensing may be alleviated by compensating with a single element lens in the resonator or concave spherical surfaces on one or both rod surfaces. Simultaneous correction for thermal birefringence and bifocusing becomes more difficult, especially at laser operations at high powers with longer laser rods.

As higher and higher output powers at high beam qualities are desired for applications such as Q-switching at high repetition rates, limitations due to thermal degradation effects decrease the usefulness of laser rods. Slab lasers of usually rectangular cross section have been more successful in achieving high average powers at high beam quality. Depolarization due to thermal stress and stress-related focusing may be reduced to zero along one of the two axes of the usually rectangular cross section because the axes of the ellipsoid of the refractive index remain constant parallel to the sides of the rectangle. In contradistinction to a slab medium, the axes of the index ellipsoid of a rod change with location in the rod, resulting in depolarization losses of a linearly polarized beam. However, thermal lensing becomes more pronounced in a slab and has to be corrected with a cylindrical lens.

Slab lasers with the light beam following a zig-zag optical path controlled by internal reflection within the slab ideally may eliminate depolarization, focusing due to stress birefringence and due to the temperature dependence of the refractive index. Actual slab lasers fall short of the ideal design expectations because end effects and thermal nonuniformities have been difficult to avoid with economical designs. A major source of the degraded beam quality is the deformation of the slab's entrance and exit surfaces during operation at high average power, due to the lack of cooling, and the generation of thermal gradients in that region, causing thermal lensing effects. To our knowledge, slab lasers of three-level laser systems have not yet been constructed because ground state absorption would render them inefficient and economically unattractive.

Semiconductor laser diode end-pumped lasers have so far demonstrated the highest overall efficiency of any solid state laser systems. As they are scaled to higher powers, thermal effects again impose limits to efficient operation. Corrections to thermal aberrations have been made by shaping the rod end as an aspheric lens (cf. S. C. Tidwell, J. F. Seamans, M. S. Bowers, and A. K. Cousins, Scaling CW Diode-end-Pumped Nd:YAG Lasers to High Average Powers, IEEE J. Quantum Electronics, Vol. 28(4) 997 (1992)). The cost and technology of producing aspheric surfaces in crystalline laser media are, unfortunately, prohibitive for most practical applications. Overcoming end effects is especially difficult for three-level laser systems due to reabsorption of laser radiation by ions remaining in the ground state in the unpumped region of the lasing medium. The thickness of the laser medium has to be reduced to avoid this absorption loss. Unfortunately, the thickness is then only of the order of a few millimeters, and end effects due to thermal heating dominate. Another approach which has been taken in the prior art is to cool the laser medium below room temperature to avoid the thermally populated ground state as terminal laser level. This technique is feasible in the laboratory but presents obvious limitations to practical applications and increases systems costs.

Monolithic ring lasers of YAG or glass hosts with four-level laser systems have been constructed and operated at room temperature (U.S. Pat. No. 4,578,793; U.S. Pat. No. 4,747,111; and U.S. Pat. No. 5,027,367). Their utility for three-level laser systems has remained limited by the necessity to design them small enough to avoid excessive reabsorption losses. This requirement poses severe demands on their precision manufacture and, at the same time, thermal effects have to be counteracted by cooling to below room temperature (cf. T. S. Kubo and T. J. Kane, *Diode-Pumped Lasers At Five Eye-Safe Wavelengths*, IEEE Journal of Quantum Electronics, 28(4), 1033 (1992)).

SUMMARY OF THE INVENTION

The thermal uniformity of any three- or four-level solid laser system is improved by using a composite of lasing and non-lasing sections. This technique may also be used to eliminate any thermal distortion due to end effects of laser rods or slabs as well as reduce depolarization losses in laser rods. The most desirable and efficient solid state lasers will always be those in which the laser mode volume best overlaps the optically pumped region; this invention allows the overlap fraction to approach or equal 100 percent while also yielding the flexibility to provide optically transparent sections as needed for thermal, mechanical or optical reasons. Although these features are of significance in any solid state laser system, they are particularly important for efficient operation of laser diode side- or end-pumped rods, or face- or side-pumped slabs. The increased efficiency of operation results in more compact, less expensive laser systems of improved laser beam quality.

A preferred embodiment of the invention is to provide side-pumped laser rods with two non-lasing end sections to facilitate cooling of all laser-active sections to eliminate end effects, and, in the case of three-level laser systems, eliminate ground state absorption in the non-pumped lasing medium.

Another preferred embodiment of the invention is to provide two nonlasing end sections to side- or face-pumped laser slabs to eliminate end effects, and, in the case of three-level laser systems, eliminate ground state absorption losses in the non-pumped laser medium.

Another preferred embodiment of the invention is to provide two nonlasing end sections for a laser diode end pumped solid state laserable medium.

Another preferred embodiment of the invention is to provide one or more non-lasing sections to laser diode end pumped monolithic ring lasers to overcome thermal effects, and, in the case of three-level laser systems, eliminate the need of producing difficult to fabricate small components and operation below room temperature.

DESCRIPTION OF THE PREFERRED EMBODIMENT

Composite Formation Techniques

Figure 1A:
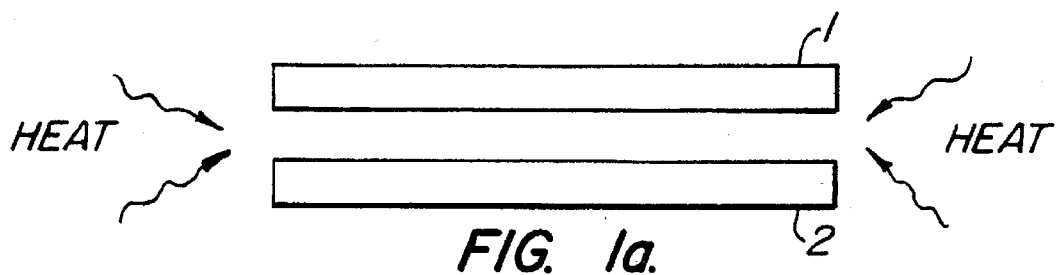
FIGS. 1a–1e shows schematically the comprehensive sequence of steps of this method to form glass-containing composite constructs.

One method of forming composites is to optically contact the surfaces to be bonded, then diffusion bond the contacted surfaces by gradually heating the surfaces to a particular diffusion bonding temperature (dependent on the particular materials used), followed by the cooling of the bonding surfaces at a rate which prevents thermal shock and allows removal of stress by annealing.

For glass-containing substances such as, for example, glass and glass ceramics, a preferred embodiment of the method of the present invention comprises: (a) optically contacting two or more surfaces of glass-containing substances to form an assembly; (b) placing the assembly onto a precision ground support surface; (c) bonding the contacted surfaces by gradually heating the assembly to a temperature corresponding to approximately 0.3 to about 1.3 times the glass transition temperature of the surface of the respective material being bonded having the lowest glass transition temperature if the substances have differing glass transition temperatures, until the surfaces bond to form a composite; and (d) cooling the composite at a rate which prevents thermal shock and allows the removal of stress by cooling.

Similarly, if the glass-containing substances have about the same glass transition temperature, then the above protocol is equally applicable with the only difference being that the heating temperature is set at about 0.3 to 1.3 times the glass transition temperature for both glass-containing substances.

It is known that glass, or glass-containing substances do not have a definite melting temperature. Hence, bonding temperatures are described and measured in relation to the subject materials to glass transition temperatures. For reference, please G. W. McLellan and E. B. Shand, *Glass Engineering Handbook*, 3d Ed., pp. 1–4.

Specifically, for glass or glass-containing substances the transition temperature is the temperature range within which the expansion of the glass makes a transition from ordinary structural expansion to expansion dominated by atomic rearrangement in the glass structure. This temperature range contains the annealing point, defined as the temperature at which the glass possesses a viscosity of $10^{13}$ poise. The maximum bonding temperature used in this invention is below the melting temperature of glass.

The techniques disclosed herein are equally applicable to crystalline substances, although the heating temperature for such materials is set at about 0.2 to 0.9 times the value of the lower of the respective surfaces' melting temperature.

Other suggested protocol is discussed below.

1. Materials of differing glass transition temperatures ($T_G$) or differing melting temperatures ($T_M$):

The optically contacted glass or glass container composite is heat treated, placing the component with higher $T_G/T_M$ on the bottom, and allowing diffusion bonding to occur at a temperature corresponding to 0.3 to 7.3 times the lower $T_G$. The component having the higher $T_G$ is placed on the bottom in order to provide a stabler support during diffusion bonding since it is less affected by the heat treatment than the component having the lower $T_G/T_M$. When materials of different melting temperature $T_M$ are employed, the optically contacted composite is heat treated at about 0.2 to 0.9 times the value of the lower $T_M$ of the respective surfaces.

2. Materials of same $T_G$:

It is possible to heat treat for diffusion bonding at a temperature below of 0.3 to 0.9 times the value of $T_G$, but the treatment time may have to be sustained for a longer duration (for example, 10 hours and more) to obtain a strong bond. While the diffusion bonding proceeds at a slower rate when conducted at these lower temperatures an advantage is realized in that a polishing operation after bonding can be abbreviated, if not eliminated altogether. This is because the flatness rehabilitation needed to eliminate distortions caused during high temperature bonding is avoided. Similarly, lower treatment temperatures of the order of 0.2 to 0.5 times the $T_M$ of crystals of the same $T_M$ may be employed, again avoiding surface damage of precision polished surfaces during heat treatment. The lower heat treatment temperatures have the additional advantage that diffusion is restricted to an atomically small region at the interface, this localization helping to prevent stress due to thermal expansion mismatches.

In any event, the present invention is not particularly limited by the above suggested bonding temperatures as the rate and extent of diffusion bonding is a function of either the temperature or duration of the heating treatment and surprisingly high and operationally useful bond strengths are achievable at the low treatment temperatures.

Additionally, the thermal expansion coefficient of the component materials of a diffusion bonded laminate is also important, particularly for sizes larger than about 1×1 inch, to prevent failure by cracking due to mechanical stress. The following protocol is advisable in this regard.

The coefficients of thermal expansion (CTE) of the component materials should be matched within about $\pm 5 \times 10^{-7}/$°C. when the composites are subjected to high treatment temperatures since at higher temperatures more extensive diffusion across the interfaces occur and the effects of mismatches in thermal expansion become more pronounced. At lower treatment temperatures although the achievable bond strengths are typically lower than those obtained at higher treatment temperatures, the effects of thermal expansion mismatches are lessened. Therefore, the lower heat treatment regime is most useful when bonding materials of different thermal expansion coefficients and melting or glass transformation temperatures. The regime of higher heat treatment temperatures is generally more applicable to materials with similar thermal expansion coefficients and when high bond strengths are required.

Additional steps, discussed hereinbelow, may be included among the above-described steps to insure uncontaminated bonding thereof and to obtain distortion-free composites. In the following discussion, these additional steps will be inserted and explained where appropriate.

The comprehensive sequence of steps (including those steps to avoid contamination) to form composite constructs is shown schematically in FIG. 1.

Figure 1B:
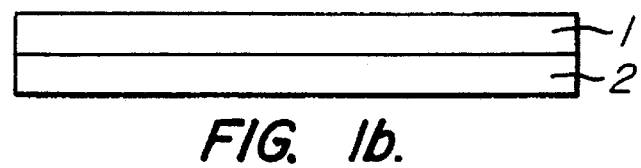

Prior to optical contacting, the surfaces to be bonded are made optically flat by conventional grinding and polishing methods. The flatness must be of the order of one wavelength of visible light per 5 to 10 cm of the surface of more accurate, depending on the aspect ratio of the components to be joined. As shown in FIGS. 1(a) and 1(b), the surfaces are cleaned, and optionally preheated to remove any absorbed water or gases, and then assembled (i.e., placed together), as in FIG. 1b, where they are optically contacted and held together by Van der Waals attraction.

Depending on the degree of cleanliness desired, the preheating and assembly may be performed in a clean, environment (e.g., a clean room), in a vacuum, or in a helium (or oxygen) filled glove box. If desired, the surfaces may be optically coated with reflection, anti-reflection or polarizing coatings for specific applications.

Figure 1C:
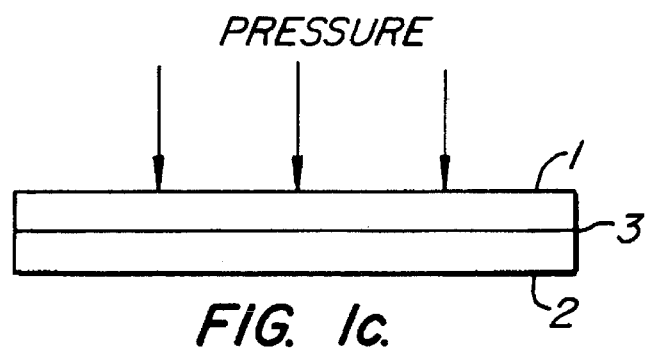

Upon assembling the surfaces, if they are sufficiently close together and clean, interference fringes will be seen immediately. Optical contact is generally indicated by the absence of interference fringes. The interference fringes will be spread out until they are no longer seen. At this point, the surfaces grip each other, but are still separable at the interface by insertion of a sharp tool. This assembly is shown in FIG. 1(c), where the pressure shown is optional and not required.

In the simplest procedure, the optical contacting process may be performed under ambient conditions in a clean room. To minimize the possibility of air pockets being formed at the interface, optical contacting may be performed inside a vacuum glove box. Alternatively, a glove box filled with helium gas can be used, which is easily and quickly diffused out of the interface, thereby keeping it free of gaseous contamination.

Figure 1D:
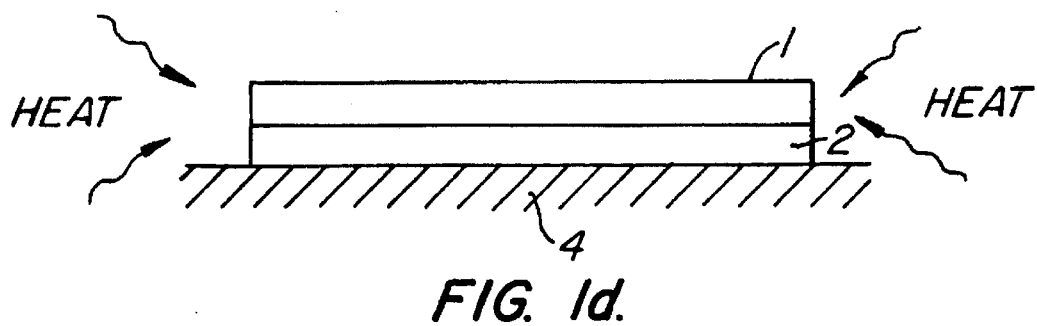

In another embodiment, after optical contacting, the sealed assembly is preferably placed on a precision ground support surface 4 and gradually heated to combine the elements into a permanently bonded composite construct 5 as shown in FIG. 1(d). The support surface may consist of, for example, graphite, polycrystalline ceramic, or fused silica and may be coated with a release agent, boron nitride, graphite, or any other suitable material. Additionally, other release agents may be used.

The elements are permanently bonded in this present method despite not becoming molten; this is due to diffusion at the optically contacted interface. Such diffusion phenomenon can involve the migration of ionic constituents of the material towards and across the interface zone. This diffusion bonding method requires longer holding times, of order of 8 to 50 hours depending on substance, temperature, pressure, and other factors, although shorter times are also possible and even preferred if long heat treatment times result in recrystallization at the interface. However, since the surfaces do not become molten, the optical contact remains true, and there is no measurable distortion at either the interface or surfaces. There is also less likelihood of dust and gas bubbles at the interfaces which may act as centers of scattering and radiation damage. Thus, high optical quality and homogeneity in the bonding composite is achieved.

Since the extent of diffusion increases with time and is approximately proportional to the square root of the time allowed for diffusion, interfaces of lower scatter may be obtained when employing bonding times of about two or four weeks assuming that the long heat treatment times do not result in any adverse side reactions such as recrystallization at the interface or in the bulk of the components. With the glass or glass-containing composites, if shorter holding times are desired, heating may be increased to 1.1 to about 1.3 times the glass transition temperature. Also, since the temperatures are relatively low, optical distortion effects are minimized.

The absence of a bonding agent or intermediate bonding film allows the surfaces to be easily separated after optical contacting, but prior to bonding, to remove impurities or to further prepare the surfaces by polishing or adding special optical coatings. Also, distortion derived from the optical characteristics of bonding agents are completely avoided. The ability to use low temperatures, made possible with this method, also allows a wider choice of materials useful for the individual layers.

In those cases where preheating the surfaces to be bonded is not necessary, the initial assembly of the elements before heat treatment can be carried out at room temperature which greatly facilitates the handling of the elements when compared to methods utilizing molten materials. Again, to further prevent contamination, the bonding process may be performed in a vacuum furnace or in a dry oxygen or helium environment or any appropriate inert or reactive atmosphere.

Figure 1E:
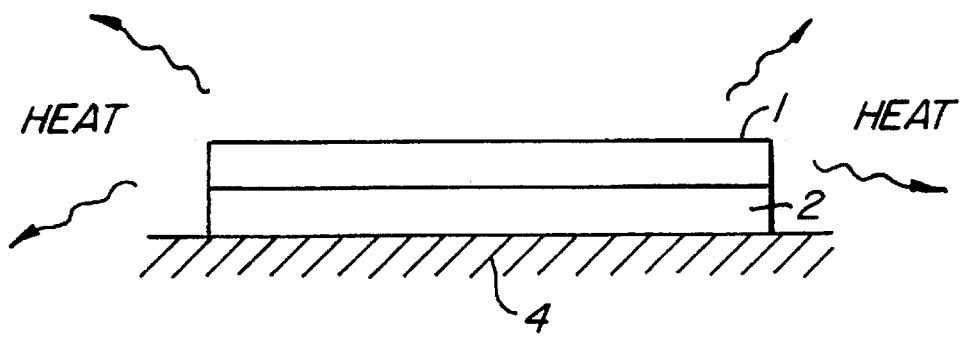

In any event, after heating the composite for the requisite holding time, optionally with application of pressure on the assembled composite, the composite is cooled at a rate which allows annealing of residual stresses. This is illustrated in FIG. 1(e). Heating causes the release of existing stresses within the crystalline and atomic structures to be alleviated; however, cooling must be conducted at a sufficiently slow rate so that the stresses will not reappear. This process is commonly referred to as "annealing". Further, where the elements to be bonded are not the same, the rate of cooling is determined by the relevant surfaces and is dependent upon the amount of stress birefringence allowable for the particular case and the dimensions of the respective elements.

As for assembly orientation, it is not necessary that the layers to be bonded rest horizontally one upon the other, since the bonding temperatures are not significantly above the transition/melting temperature and distortion or displacements due to gravitational effects are less severe. Thus, the elements may be assembled in any convenient position.

Composite Laser Embodiments

The most generally applicable embodiment of this invention consists of composites of lasing and non-lasing components of the same host lattice for the purpose of improved thermal uniformity during laser operation. This benefit is achieved for quasi-three- and four-level laser systems which are flashlamp- or laser diode pumped. The most important representative of a four level laser system at room temperature is the laser transition of the $Nd^{3+}$-ion from the $^4F_{3/2}$ to the $^4I_{11/2}$ level, emitting radiation at 1.06 µm, and from the $^4F_{3/2}$ to the $^4I_{13/2}$ level, lasing at 1.3 µm. The additional benefit of elimination of ground state absorption at room temperature operation with a side-pumping scheme is realized for any quasi-three-level lasing system where the lasing transition terminates at the ground state manifold due to population of its crystal field levels by thermal energy. Examples of paramagnetic ions belonging to this category are the transitions for $Nd^{3+}$ from $^4F_{3/2}$ to $^4I_{9/2}$, lasing at about 0.94 µm; for $Ho^{3+}$ from $^5I_7$ to $^5I_8$, lasing at 2.1 µm; for $E^{3+}$ from $^4I_{13/2}$ to $^4I_{15/2}$, lasing at about 1.5 µm; for $Tm^{3+}$ from $^3F_4$ to $^3H_6$, lasing at about 2.1 µm; $Yb^{3+}$ from $^2F_{5/2}$ to $^2F_{7/2}$, lasing at about 1.03 µm. Laser transitions for 3d-ions such as $Ti^{3+}$ in sapphire, $C^{3+}$ in sapphire, $Cr^{3+}$ in $BeAl_2O_4$, $Ni^{2+}$ in MgO and $Co^{2+}$ in $MgF_2$ all terminate in the ground state. Therefore, the efficiency of side-pumped laser rods is significantly improved for room temperature operation by applying this invention.

The most preferred host lattices of this invention for rare earth lasing ions are of cubic structure because there is no need to precisely orient the non-lasing end sections to crystallographically correspond to the lasing section. Crystal boules of cubic host lattices such as yttrium aluminum garnet ($Y_3Al_5O_{12}$, YAG), gadolinium gallium garnet ($Gd_3Ga_5O_{12}$, GGG), gadolinium scandium gallium garnet ($Gd_3Sc_2Ga_3O_{12}$, GSGG) or related oxide crystals are all routinely grown parallel to the crystallographic [111] direction. The non-lasing end pieces only have to be parallel to the [111] direction but may be of arbitrary orientation in the plane perpendicular to it. On the other hand, the thermal expansion coefficients of non-cubic materials are in general different in different crystallographic orientations. To avoid thermal stresses between components of different orientations, all components have to be bonded in crystallographic alignment. This may readily be accomplished by X-ray orientation but requires additional care over using cubic crystals. Lasing and non-lasing components of sapphire, $YVO_4$ or $LiYF_4$ serve as prime examples for this case.

The length of the non-lasing end sections is chosen in accordance with the principle of Saint-Venant which states that end effects produce noticeable deformations only in regions of a body which are within a distance of approximately the diameter in the case of a rod or the thickness in the case of a part of rectangular cross section (cf. S. P. Timoshenko and J. N. Goodier, *Theory of Elasticity*, Sec. 19, McGraw-Hill 1983). This minimum preferred length may be exceeded without any detrimental effects. Shorter lengths are also operational but will not provide complete elimination of end effects. Longer end sections are chosen for ease of fixturing and manufacturability, or for optical design considerations to provide a means for channeling radiation to the lasing medium. Interfaces between lasing and non-lasing sections are preferred to be parallel to each other to provide a uniform and accurately defined thickness of the lasing medium, resulting in remaining gradients of temperature and refractive index which are symmetric with respect to the optical axis. The most preferred configurations of this invention have all in common that they consist of a composite with two parallel interfaces. A logical extension are composites where lasing and nonlasing media alternate with each other, having a total of four, six or more interfaces for further improved temperature uniformity. Similarly, non-parallel or spherical interfaces have utility in solid state laser devices.

Figure 2A:
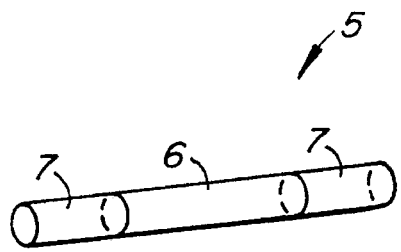
FIGS. 2a and 2b is a diagram of a composite laser rod according to a preferred embodiment of the invention.

A preferred embodiment of this invention is illustrated in FIG. 2a where a composite laser rod 5 consists of the central lasing section 6 which has non-lasing cylindrical end pieces 7 attached to it by diffusion bonds without an adhesive medium at the interface. The most important advantage of laser rod 5 is realized for lasing sections operating as a quasi-three-level laser system. In addition to improved thermal uniformity, the losses due to ground state absorption have been eliminated by restricting the laser-active section to the inside of a laser cavity where it may be effectively side-pumped, and cooled by circulating coolant fluid. The resulting improvements over the prior art are exemplified by a specific laser system, to be described in the following. For the purpose of producing a diffusion bonded composite rod of 3 mm diameter, the end faces of a single crystal of 4% Tm, 0.36% Ho in a YAG host crystal of dimensions 6×6×30 $mm^3$ were precision polished to an optical surface figure of about 1/10 of a wavelength, assembled by optically contacting with similarly precision polished end faces of YAG without dopant ions of dimensions 6×6×18 $mm^3$. The long axis of all three parts is parallel to the crystallographic [111] direction. The two interfaces of 6×6 $mm^2$ are inspected for absence of any inclusions in a darkened area with high intensity illumination. They are then gradually heated to 1600° C., and treated at this temperature for 72 hours before being gradually cooled back to room temperature. The interfaces of the composite are again inspected for absence of scattering inclusions. Thereafter, the square cross section of the composite is changed to circular by a grinding process. After a number of fine grinding steps leading to a diameter of the composite rod of 3 mm, the cylindrical surface of the rod is inspection polished. Finally, the faces of the laser rod are precision polished and optically coated with antireflection coatings effective for a wavelength of 2.1 µm.

The resulting laser rod consists of a 30 mm long and 3 mm diameter lasing section of 4% Tm, 0.36% Ho in a YAG host crystal, to which two 16 mm long and 3 mm diameter non-lasing sections, consisting of YAG without any dopant ions, have been fused by diffusion bonding. This rod is located inside a cavity where it is side-pumped with seven symmetrically arranged banks of laser diode arrays of high duty cycle. Comparing the lasing performance of composite rod 5 with a rod consisting of a lasing section of the same length, but with sapphire sleeves attached to it with epoxy resin, the slope efficiency is doubled, the observed thermal lensing is only about one fourth, and the beam quality has greatly improved. Therefore, it is possible to operate rod 5 at much higher repetition rates than is possible with the configuration of the above prior art. A maximum power output of 40 Watts has been achieved at repetition rates of 130 Hertz. This improved performance is realized although ground state absorption has also been avoided in the above prior art. The performance improvement is even more pronounced when comparing composite rod operation with standard prior art laser rods without sapphire sleeves.

Figure 2B:
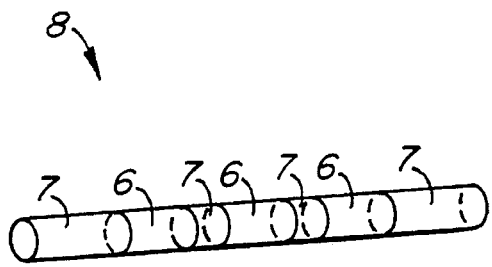

FIG. 2b illustrates a more elaborate design of a composite rod 8 with alternating lasing sections 6 and non-lasing sections 7 which are diffusion bonded to each other. The thickness of individual sections along the cylinder axis is chosen so that each laserable section maintains an essentially uniform temperature distribution during lasing operation. A typical thickness corresponds to about one rod diameter.

Figure 3A:
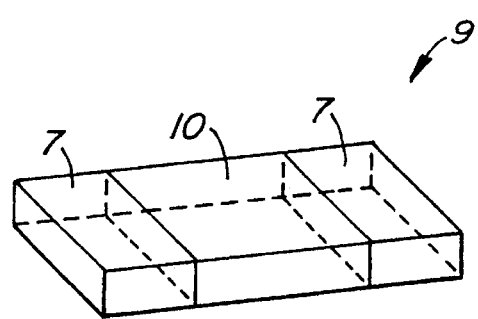
FIGS. 3a and 3b are diagrams of composite laser slabs according to another preferred embodiment of the invention.
Figure 3B:
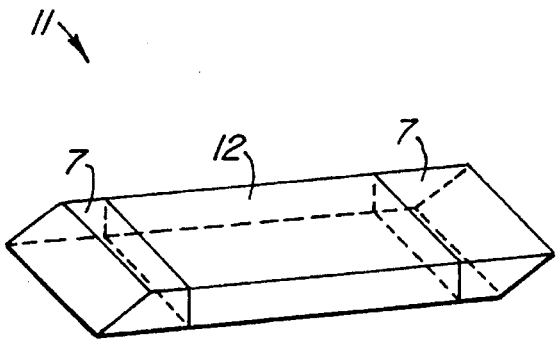

FIGS. 3a–b depict two preferred embodiments of a composite laser slab. Laser radiation propagates through the rectangular cross section of slab 9 of FIG. 3a parallel to its large faces. Section 10 of 30×10×3 mm$^3$ consists of laser-active 0.8% Cr, 6% Tm, 0.36% Ho doped into a YAG single crystal host lattice, and is located inside of a pump cavity. Its two 10×30 cm$^2$ faces are uniformly pumped and cooled by fluid convection. Non-lasing end sections 7 are attached by diffusion bonding to component 10, forming interfaces of dimensions 10×3 mm$^2$. These interfaces are essentially free of scattering imperfections and absorbing species, and do not contribute to beam degradation. Since sections 7 are non-lasing, they do not produce any thermal distortions of the ends of the composite slab, and also do not cause losses due to ground state reabsorption. The composite slab of FIG. 3a is produced by precision polishing starting components of a laser-active crystal of 5×12×30 mm$^3$ and non-lasing crystals of 5×12×17 mm$^3$ on their 5×12 mm$^2$ faces to a flatness of about 1/10 of one wavelength of visible light. Subsequently, the clean interfaces are optically contacted, inspected, heat treated for diffusion bonding to take place, and gradually cooled to room temperature. Excess material is removed by milling and grinding. Then, the composite slab is finished by the same processes as are employed for noncomposited slabs, and are provided with an antireflection coating operative at 2.1 µm on the undoped entrance and exit faces of 5×12 mm$^2$. A critical requirement of a mechanically strong composite slab is the absence of any unbonded surfaces at the interfaces. Any unbonded remaining areas act as stress concentrators and may become the origin of fractural failure when subjected to thermal or mechanical stress.

FIG. 3b shows an alternative design of a composite slab 11 where laser radiation propagates in a zig-zag path. As in FIG. 3a, the composite slab 11 is free of undesirable thermal end effects. It is fabricated in the same manner as slab 9 of FIG. 3a by diffusion bonding. Brewster faces are produced during finishing according to well established processes. Therefore, no antireflection coatings on the entrance and exit faces are required.

Figure 4A:
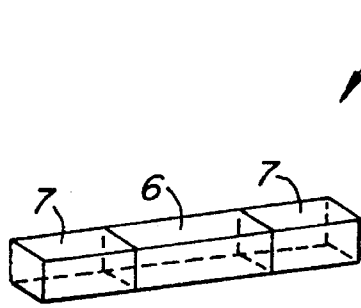
FIGS. 4a and 4b are diagrams of end pumped four- and three-level composite laser media.
Figure 4B:
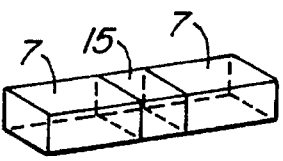

FIGS. 4a–b show schematically that the same principle of non-lasing end sections is employed for semiconductor diode end pumped systems. The thermal uniformity is again improved for a four-level lasing ion when it is end pumped through at least one of the two non-lasing components. A square cross section of the composite 13 perpendicular to the optical axis is preferred when the part is additionally cooled by heat transfer from a cooled metal support structure. In contradistinction to the prior art, the attached undoped end sections 7 allow surrounding the full length of the lasing section with a cooling jacket of a circulating fluid. The end sections function as heat sinks as well as integral holders of the end pumped laserable central part. For the case of employing a cooling jacket, a circular cross section of the composite rod analogously to FIG. 2 is preferred to confine the cooling fluid with O-ring seals over the undoped end sections. An end pumped three-level lasing system is illustrated in FIG. 4b. Although similar to a composite structure 13 for four-level lasing operation, the length of the lasing medium 15 has to be chosen so that there is sufficient pump radiation to excite all ions in the path of laser radiation to avoid ground state absorption. This length is typically between 2 to 3 mm for end pumping from one end only. Undoped end sections 7, attached by a diffusion bonding process as described above, perform the functions of greatly improved thermal uniformity by efficient conduction of heat from the lasing medium to the non-lasing ends, increasing the capability of more efficient heat removal through the side surfaces by having a greatly increased surface area for cooling, and providing a means of much improved handling and fixturing of the lasing medium.

Figure 5A:
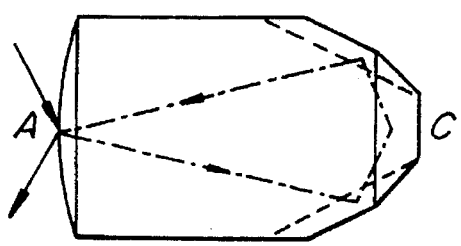
FIGS. 5a–d are diagrams of a ring laser of the prior art and one composite ring laser according to this invention.
Figure 5C:
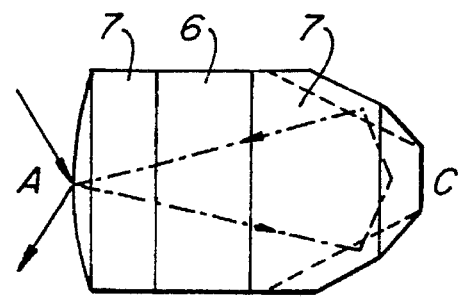
Figure 5B:
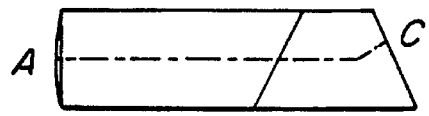
Figure 5D:
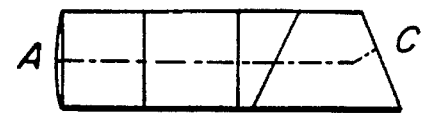

Besides the general utility of these features for three-level lasing systems, an additional advantage is realized for the special case of an end pumped monolithic ring laser. Since the length of the lasing medium is limited by ground state absorption in the prior art, a compromise between manufacturability and absorption loss had to be reached. This restriction is overcome by constructing a ring laser with a non-lasing section for input and output beams, a lasing section sandwiched between it and another non-lasing section which contains prism surfaces to provide for total internal reflection along a closed ring path. A composite ring laser can be designed for optimum performance, and in dimensions which are more readily cooled and more economically manufactured. This invention allows for the first time designing for room temperature operation of three-level lasing ring lasers. FIGS. 5a–b schematically shows a ring laser of the prior art, as described in U.S. Pat. No. 4,747,111. The overall length of this configuration is about 6 mm when it is designed for operation with a four-level laserable medium as exemplified by Nd:YAG lasing at 1.06 µm. Since the optical path of the laser radiation is still longer, the length of the design has to be reduced to below 3 mm to avoid excessive ground state absorption for a quasi-three-level system. This poses a formidable challenge for precision manufacture while it increases simultaneously the problems of effective heat removal from the end pumped spherical surface. FIGS. 5c–d illustrates an embodiment of the present invention. The composite configuration allows any optimum optical path length of the central lasing section, even below 1 mm if desirable. The overall length is kept to about 6 to 7 mm by diffusion bonding two non-lasing sections to the laser-active medium. The composite structure is then precision-shaped according to the requirements of a readily manufacturable design into a ring laser illustrated in FIGS. 5c–d.

While the invention has been described for certain embodiments, different configurations may be used. For example, composites consisting of alternating parallel layers of lasing and non-lasing media with interfaces enclosing a non-zero angle with the cylinder axis may be employed for further improved thermal uniformity, and pumping efficiency. Conditions of heat treatment for diffusion bonding may vary. These and other modifications and changes may be made without departing from the spirit and scope of the invention as described by the following claims.

What is claimed is:

1. A solid, optically pumped laser device comprising:

a composite configuration shaped as a cylindrical rod including an ionic lasing medium containing one or more paramagnetic ions, said lasing medium having a first optically flat end face and a second optically flat end face, said first end face diffusion bonded to a first non-lasing ionic medium to form a first interface and said second end face diffusion bonded to a second non-lasing ionic medium to form a second interface, wherein said first and second interfaces are of optical quality and permanently bonded using an adhesive-free diffusion bonding technique;

optical pumping means for transmitting optical radiation into said lasing medium, said optical radiation sufficient to initiate lasing; and means for passing coherent electromagnetic radiation through said cylindrical rod to said first and second interfaces.

2. The solid, optically pumped laser device according to claim 1, wherein the ionic lasing medium and the first and second non-lasing ionic media are of a cubic garnet structure with a crystallographic [111] orientation parallel to a cylindrical axis of said cylindrical rod.

3. The solid, optically pumped laser device according to claim 1, wherein the ionic lasing medium consists of yttrium aluminum garnet containing at least one of the ions selected from the group consisting of $Ho^{3+}$ and $Tm^{3+}$, the non-lasing ionic media consist of undoped yttrium aluminum garnet, and the composite configuration has a polished cylinder surface.

4. The solid, optically pumped laser device according to claim 1, wherein the pumping means is comprised of semiconductor laser diodes.

5. The solid, optically pumped laser device according to claim 1, wherein said ionic lasing medium is comprised of a plurality of lasing media connected by diffusion bonded non-lasing medium.

6. The solid, optically pumped laser device according to claim 1, wherein said lasing medium consists of glass and contains $Er^{3+}$ as paramagnetic ion, and wherein said non-lasing ionic media have a first coefficient of thermal expansion and a first refractive index which essentially matches a second coefficient of thermal expansion and a second refractive index of said lasing medium.

7. The solid, optically pumped laser device according to claim 1, further comprising:

a cooling jacket surrounding the length of said lasing medium, said cooling jacket sealably coupled to said first and second non-lasing ionic medium; and a coolant fluid in contact with said lasing medium and confined by said cooling jacket.

8. A solid, optically pumped laser device comprising:

a composite configuration shaped as a laser slab of essentially rectangular cross section including an ionic lasing medium containing one or more paramagnetic ions, said lasing medium having a first optically flat face and a second optically flat face, said first face diffusion bonded to a first non-lasing ionic medium forming a first essentially rectangular interface and said second face diffusion bonded to a second non-lasing ionic medium forming a second essentially rectangular interface, wherein said first and second interfaces are of optical quality and permanently bonded using an adhesive-free diffusion bonding technique;

optical pumping means for transmitting optical radiation into said lasing medium, said optical radiation sufficient to initiate lasing; and means for passing coherent electromagnetic radiation through said non-lasing media of said composite laser slab.

9. The solid, optically pumped laser device according to claim 8, wherein coherent electromagnetic radiation propagates perpendicular to the rectangular cross section of said composite laser slab.

10. The solid, optically pumped laser device according to claim 8, wherein coherent electromagnetic radiation propagates at an angle to the rectangular cross section of said composite laser slab by means of a plurality of total internal reflections.

11. The solid, optically pumped laser device according to claim 8, further comprising:

a cooling jacket surrounding the length of said lasing medium, said cooling jacket sealably coupled to said first and second non-lasing ionic medium; and a coolant fluid in contact with said lasing medium and confined by said cooling jacket.

12. A solid, optically pumped laser device comprising an ionic lasing medium containing at least one paramagnetic ion, with two optically flat faces, to which at least one non-lasing ionic medium has been attached by diffusion bonding, forming a composite construction with one or more interfaces which are of optical quality and permanently bonded using an adhesive-free diffusion bonding technique;

optical pumping means for transmitting optical radiation across at least one of said non-lasing media to said ionic lasing medium, said optical radiation sufficient to initiate lasing;

and means of passing coherent electromagnetic radiation through said composite construction.

13. The solid, optically pumped laser device according to claim 12, wherein said ionic lasing medium comprises a quasi-three-level lasing system with a first and a second non-lasing end section attached; said ionic lasing medium is of the shape of a composite cylinder; said ionic lasing medium is cooled by a cooling jacket extending at least over the total length of the ionic lasing medium; and wherein coherent radiation passes essentially perpendicular to the interfaces.

14. The solid, optically pumped laser device according to claim 12, wherein said ionic lasing medium has a first and a second non-lasing end sections attached, said non-lasing end sections shaped to direct coherent electromagnetic radiation in an essentially closed, nonplanar polygonal path by means of total internal reflections on said non-lasing end sections.

* * * * *